United States Patent
Yamazaki et al.

[11] Patent Number: 6,038,018
[45] Date of Patent: Mar. 14, 2000

[54] SUBSTRATE INSPECTING APPARATUS, SUBSTRATE INSPECTING SYSTEM HAVING THE SAME APPARATUS AND SUBSTRATE INSPECTING METHOD

[75] Inventors: Yuichiro Yamazaki, Edogawa-Ku; Motosuke Miyoshi, Minato-Ku, both of Japan

[73] Assignee: Kabushiki Kaisha Toshiba, Kawasaki, Japan

[21] Appl. No.: 09/311,271

[22] Filed: May 14, 1999

[30] Foreign Application Priority Data

May 15, 1998 [JP] Japan ................................. 10-133905

[51] Int. Cl.⁷ .................................................. G01N 21/00
[52] U.S. Cl. ....................... 356/237.1; 356/376; 356/334; 356/394
[58] Field of Search ................................ 356/237.1, 376, 356/334, 394

[56] References Cited

U.S. PATENT DOCUMENTS 5,535,006  7/1996  Telschow et al. .................... 356/237.1
5,757,474  5/1998  Sopovi et al. ............................ 356/72

*Primary Examiner*—Frank G. Font
*Assistant Examiner*—Reginald A. Ratliff
*Attorney, Agent, or Firm*—Oblon, Spivak, McClelland, Maier & Neustadt, P.C.

[57] ABSTRACT

A substrate inspecting system 60 observes and inspect a semiconductor wafer pattern by irradiating the surface of the semiconductor wafer 11 with electron beams 31, and making a projection unit project in enlargement secondary electrons, reflected electrons and backward scattered electrons generated therefrom in the form of secondary electron beams 32 on an undersurface of an electron beam detecting unit 61, and form an image thereon. The substrate inspecting system 60 includes a parallel-plate type energy filter 33 in a projection system. The present invention discloses a substrate inspecting apparatus capable of detecting a voltage contrast defect on a sample with a high accuracy by separating the secondary electron beams and fetching a secondary electron beam having an energy over a predetermined value, and of quantitatively measuring this defect, a substrate inspecting system having this apparatus, and a substrate inspecting method.

16 Claims, 16 Drawing Sheets

SUBSTRATE INSPECTING APPARATUS, SUBSTRATE INSPECTING SYSTEM HAVING THE SAME APPARATUS AND SUBSTRATE INSPECTING METHOD

BACKGROUND OF THE INVENTION

The present invention relates generally to a substrate inspecting apparatus using electron beams, a substrate inspecting system and a substrate inspecting method, and more particularly to an inspecting apparatus, an inspecting system and an inspecting method which are suitable for inspecting defects on a semiconductor wafer and a photo mask.

With a higher integration of the semiconductor device, there has increasingly been enhanced a sensitivity required for detecting a defect and a foreign material on a semiconductor wafer and a photo mask. In general, a detection sensitivity under of a width of a pattern wire is needed for detecting the pattern defect and the foreign material which might cause a serious deterioration in terms of a quality of the product. Therefore, in the semiconductor wafer defect inspection with a design rule of ¼ μm or under, its pursue has come in recent years substantially to a limit of the pattern defect inspection based on an optical system. Such being the case, pattern defect inspecting apparatuses using electron beams have been developed as a substitute for the optical system inspection, which were disclosed in Japanese Patent Application Laid-Open Publication Nos.5-258703 (1993) and 7-249393(1995).

Japanese Patent Application Laid-Open Publication No. 7-249393 discloses a method and an apparatus for detecting a pattern defect on a semiconductor wafer which involve the use of the electron beams. FIG. 1 shows the pattern defect detecting apparatus.

As illustrated in FIG. 1, a pattern defect detecting apparatus 80 comprises a primary optical system 81 including an electron gun, having a rectangular electron emission surface cathode, for irradiating a surface 85 of a sample 82 with electron beams 88 each taking a rectangular shape in section, and a quadrupole lens system. The apparatus 80 also comprise a secondary electron detecting system 84 including an electron beam detecting unit 86 for detecting secondary electrons, reflected electrons and backward scattered electrons 83 generated on the sample, and a mapping projection optical element for forming on the detecting unit 86 secondary/primary images of the secondary electrons, reflected electrons and backward scattered electrons 83, and further a detection signal processing circuit 87 for processing detection signals.

In the pattern defect detecting apparatus 80, the section of the electron beam falling upon the sample surface takes not circular and square shapes but the rectangular shape, thereby reducing a scan time. Besides, an aspect ratio of the rectangular electron beam is properly set, thereby controlling a density of the electric current of the electron beams. Further, the image signals detected by the electron beam detecting unit 86 are processed in parallel, and therefore this apparatus has such an advantage that the defect on the wafer pattern can be detected at a high speed.

In the defect inspection using the electron beams, in addition to the detection of a minute pattern defect on the wafer surface, it is feasible to detect even a defect on the semiconductor wafer, which is derived from an electric continuity defect (such as open- and short-circuit) by utilizing an image contrast (voltage contrast) occurred due to a difference in electric potential on the sample surface. The defect with an abnormality of the electric conduction inducing the above voltage contrast, is known as a voltage contrast defect. The principle for detecting this voltage contrast defect will be explained with reference to the drawings.

The sample surface is charged up upon the irradiation of the electron beams. A (positive/negative) polarity of the charging up at that time is determined based on a material of the surface of the semiconductor wafer as well as on an energy of the irradiated electrons. FIG. 2 is a sectional view schematically showing one example of the semiconductor wafer irradiated with the electron beams. When a semiconductor wafer 100 shown in FIG. 2 is irradiated with, e.g., electron beams 101 having a predetermined energy quantity, an electrically floating Al electrode pattern 92 on the wafer surface is charged up to the negative polarity. While on the other hand, when irradiated with the electron beams of which an acceleration voltage is on the order of 1 keV, a pattern 91 of an insulating layer composed of $SiO_2$ etc. is charged up to the positive polarity. Further, if grounded as in the electrode pattern 93 even in the case of a pattern composed of the same material Aluminum (Al), the electron beams flow across the substrate, resulting in no charging up. Thus, the sample surface is charged up to the positive or negative polarity with a variety of values upon the irradiation of the electron beams, whereby the electric potential is induced on the sample surface. With this surface potential, there change an emission efficiency of the secondary electrons, the reflected electrons and the backward scattered electrons occurred on the sample, and a detection efficiency at which those electrons generated thereon are taken in by the detector. In the example shown in FIG. 2, there are a high emission efficiency and a high detection efficiency of the secondary electrons, reflected electrons and backward scattered electrons 102 occurred on the Al electrode pattern 92, and therefore a quantity of the detection signals by the electron detector is large. An electron emission efficiency of secondary electrons, reflected electrons and backward scattered electrons 103 occurred on the Al electrode pattern 93 becomes smaller due to the charging up than on the pattern 92. Hence, the quantity of the detection signals by the electron detector is smaller than in the case of the pattern 92. By contrast, on the insulating layer pattern 91, there are a large quantity of the secondary electrons, the reflected electrons and the backward scattered electrons which are absorbed to the substrate surface charged up to the positive polarity, and therefor the quantity of the detection signals is by far smaller than on other portions (the Al electrode patterns 92, 93).

Such a change in the detection signal quantity which is based on the change in the surface potential of the sample, appears as an image contrast of the electron image formed by the projection unit. This electron image contrast is termed a voltage contrast. Generally, the voltage contrast appears in the form of the charging up of the secondary electron image on a scanning electron microscope, or is utilized for an EB tester analysis.

The images of the secondary, reflected and backward scattered electrons, which are obtained by irradiating the surface of the semiconductor wafer with the electron beams, in variably contain the voltage contrast in addition to a contrast (configurational contrast) appearing depending on a configuration. Accordingly, if the electrical conduction defective portions such as the open- and short-circuits exist mutually in the interconnections and contact holes of the semiconductor interconnection pattern, the surface potentials at the defecting portions are different from the surface potential at the electrically normal portion, and consequently the voltage contrasts different from that at the normal portion appear.

For example, as in a semiconductor wafer 110 shown in FIG. 3, interconnection patterns 112, 113 composed of tungsten (W) will be explained. The interconnection patterns 112, 113 are each so designed as to be grounded and must have a decreased detection rate of the secondary electrons, the reflected electrons and the backward scattered electrons. As shown in FIG. 3, however, the contact hole is not sufficiently formed in the interconnection pattern 113, resulting in a state of the open-circuit. A large amount of the secondary electrons, the reflected electrons and the backward scattered electrons are thereby detected from the interconnection pattern 113, and it follows that the voltage contrast different from the electrically normal portion is detected in the detection image. The voltage contrast, of which an electric conduction condition is different from the normal portion, is hereinafter referred to as an abnormal voltage contrast.

Thus, the electric conduction defective portion on the semiconductor wafer can be inspected by detecting the abnormal voltage contrast.

There arises, however, a problem inherent in the prior art described above, wherein a detection accuracy of the abnormal voltage contrast declines for the following reason.

Namely, the surface potential of the voltage contrast defect is estimated to be under 10V, and hence it is required that a voltage contrast image corresponding to a difference in terms of the surface potential be used for detecting the above-described defect. Accordingly, when forming an image of the electrons having an energy width over the surface potential difference, an energy component exceeding the surface potential difference turns out to be a noise component, which might be a factor for deteriorating the detection accuracy of the abnormal voltage contrast. According to the prior art described above, the images of the electrons in all the energy ranges of the secondary electrons, the reflected electrons and the backward scattered electrons generated on the wafer serving as a sample, are formed on the detector, and hence it follows that the voltage contrast images obtained therefrom are formed of the electrons exhibiting the continuous energies. Therefore, the problem is that it is therefore difficult to detect a minute different in the surface potential on the wafer sample.

Further, in the prior art discussed above, it is unfeasible to quantitatively measure an electric characteristic of the voltage contrast defect from the obtained voltage contrast image.

As explained above, the defect electric characteristic such as the contact resistance value reflects in the surface potential of the wafer sample. Accordingly, if capable of quantitatively measuring the surface potential with respect to the voltage contrast image, the electric characteristic can be quantitatively measured, and its effect is extremely large.

SUMMARY OF THE INVENTION

It is a primary object of the present invention to provide a substrate inspecting apparatus, a substrate inspecting system including this apparatus and a substrate inspecting method which are capable of detecting a voltage contrast defect on a sample with a high accuracy, and quantitatively measuring this defect.

The substrate inspecting apparatus according to the present invention comprises an electron beam energy filtering element for separating secondary electron beams according to every energy component corresponding to an electric state on the surface of a sample, and fetching the separated secondary electron beam, whereby an S/N ratio of an image signal representing a physical/electric state on the substrate surface can be enhanced. This enables especially a detection sensitivity to be enhanced in the voltage contrast defect inspection for detecting from a difference in the surface potential a defect from which to cause an abnormality in electric conduction.

When the electron beam energy filtering element is a magnetic field type energy filter for separating the electron beams according to each of a plurality of energy regions and fetching the separated electron beam, and if a plurality of electron beam detecting units are provided corresponding to the plurality of energy regions, signal images of the plurality of energy regions can be simultaneously taken in.

The substrate inspecting method according to the present invention comprises a step of separating the secondary electron beams according to every energy region, and fetching the separated secondary electron beam, and it is therefore feasible to inspect a physical/electric state on the substrate surface with an excellent detection sensitivity.

The substrate inspecting system according to the present invention, which includes the substrate inspecting apparatus, operates based on the substrate inspecting method described above and is therefore capable of inspecting the physical/electric state on the substrate surface with the excellent detection sensitivity. Particularly when controlling a voltage applied to the electron beam energy filtering element so that a quantity of detection signals becomes fixed, a relative surface potential can be measured from a quantity of change in a control voltage, so that an electric characteristic of the voltage contrast defect, such as a resistance value, etc. can be quantitatively measured.

BRIEF DESCRIPTION OF THE DRAWINGS

In the attached drawings.

DESCRIPTION OF THE PREFERRED EMBODIMENTS

Figure 1:
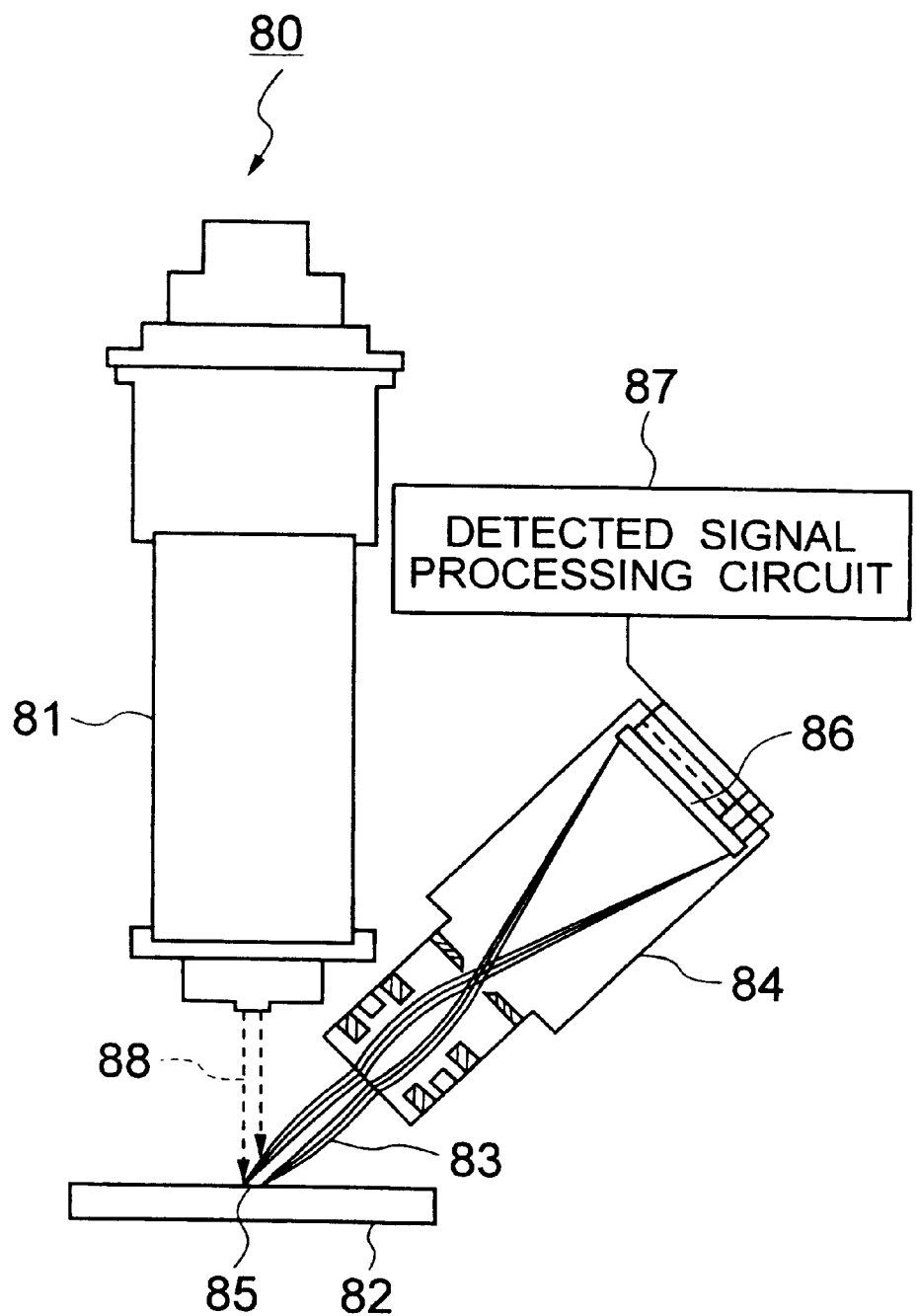
FIG. 1 is a block diagram showing one example of a semiconductor wafer pattern defect inspecting apparatus according to the prior art.
Figure 2:
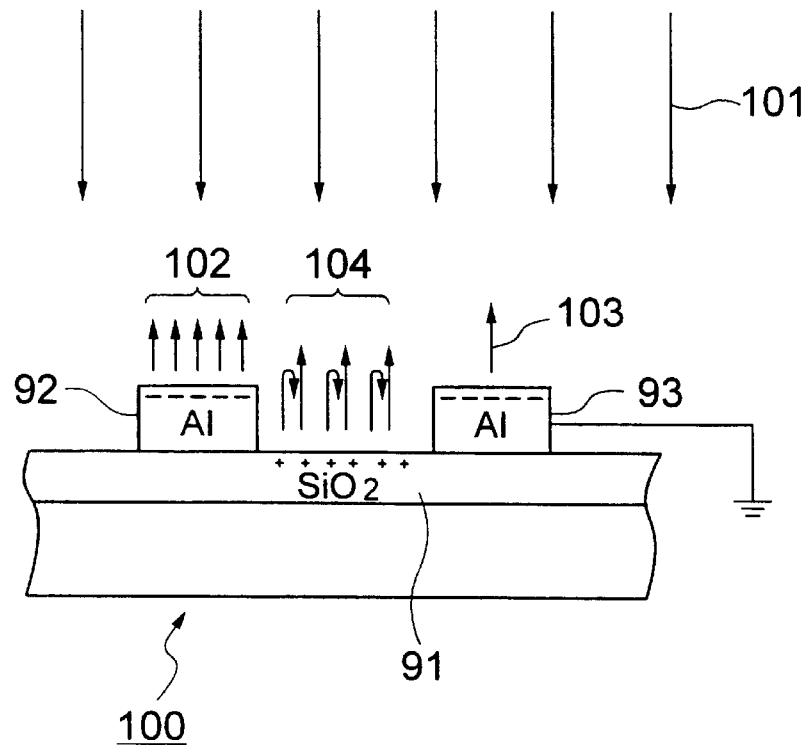
FIG. 2 is a partial sectional view, showing one example of a semiconductor wafer, for explaining the principle of detecting a voltage contrast defect.
Figure 3:
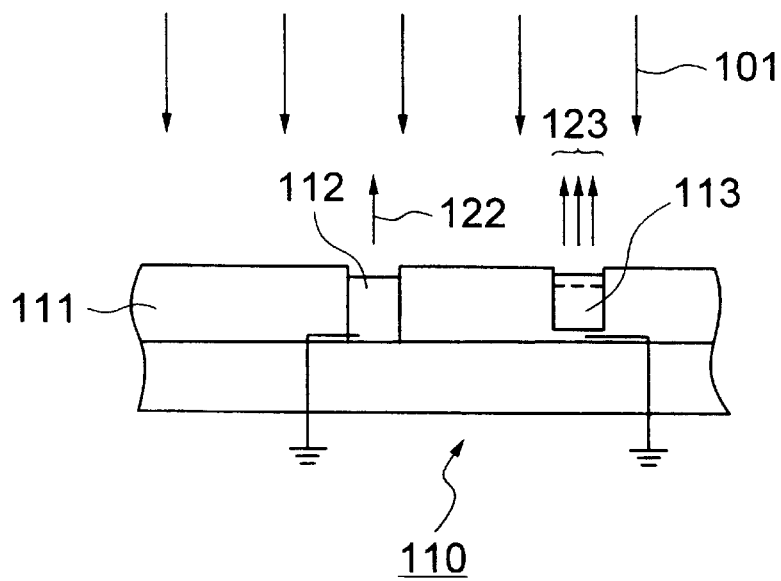
FIG. 3 is a partial sectional view, showing another example of the semiconductor wafer, for explaining the principle of detecting the voltage contrast defect.

Preferred embodiment so the present invention will hereinafter be discussed with reference to the accompanying drawings.

Note that the same components are marked with the same reference numerals throughout the following drawings, and repetitive explanations thereof are properly omitted.

Figure 4:
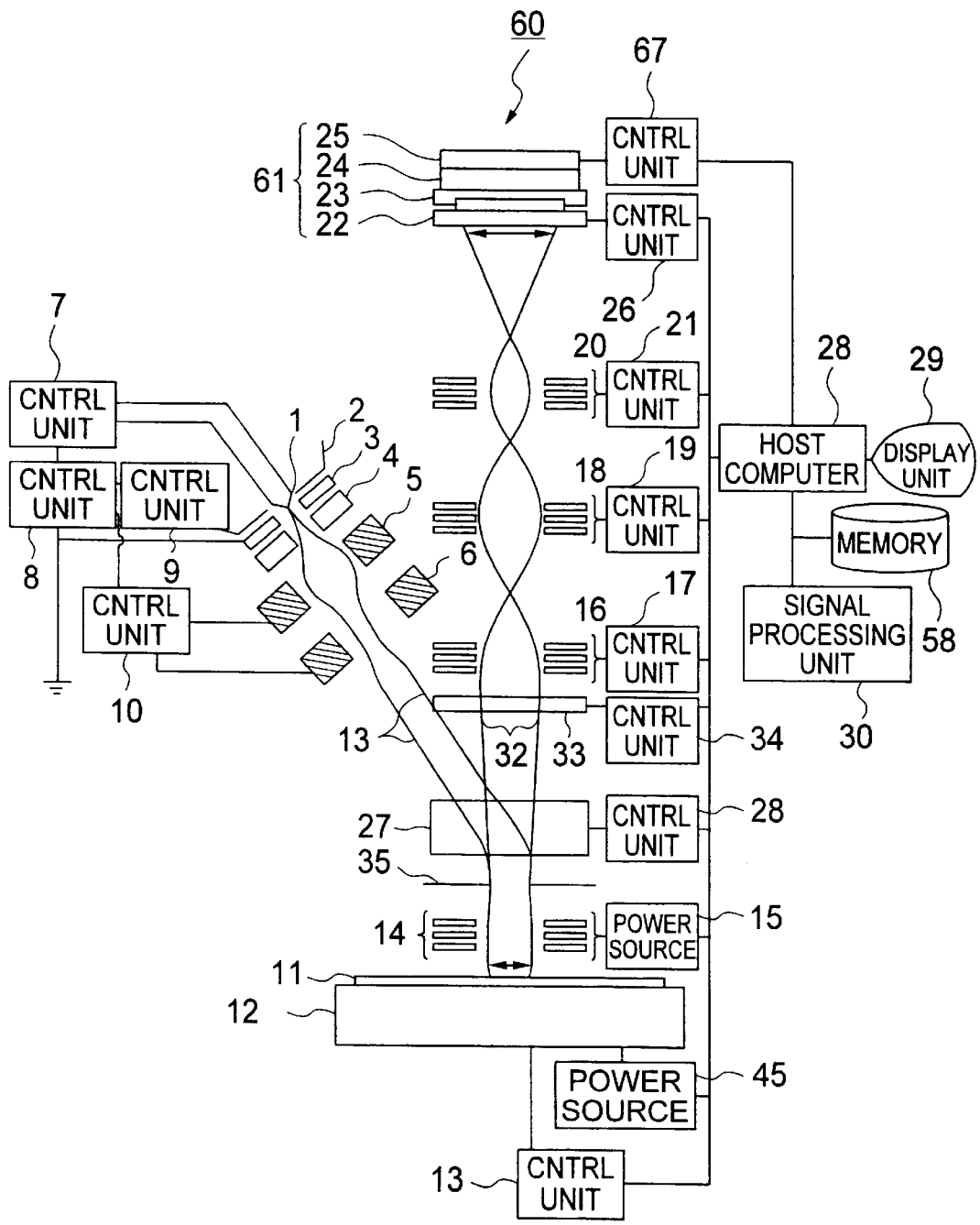
FIG. 4 is a block diagram showing a basic construction of a first embodiment of a substrate inspecting system according to the present invention.

FIG. 4 is a block diagram showing a basic construction of a substrate inspecting system in a first embodiment of the present invention. A substrate inspecting system 60 in the first embodiment is characterized by including an electron beam energy filtering elements designated by the numerals 33, 34 in FIG. 4.

To start with, the construction of the substrate inspecting system 60 in the first embodiment will be explained.

The substrate inspecting system 60 shown in FIG. 4 includes a primary electron beam irradiating unit, a control unit thereof, a sample 11, a control unit of the sample 11, a secondary electron beam projection unit, a control unit thereof, an electron beam detecting unit 61, control units 26, 67 thereof, an electron beam deflector 27 and a control unit 28 thereof. The sample 11 is defined as a substrate such as a semiconductor water and a photo mask etc, and in the first embodiment the semiconductor wafer (hereinafter simply referred to as a wafer) is exemplified as a sample.

As illustrated in FIG. 4, the electron beam irradiating unit is disposed with a skew to the direction perpendicular to the surface of the wafer 11, and an optical axis of the secondary electron beam projection unit in the direction perpendicular to the surface of the wafer 11. With this configuration, a primary electron beam 31 is incident upon the electron beam deflector 27 from a direction inclined to the surface of the wafer 11, and the irradiating direction of the electron beam 31 is deflected by the electron beam deflector 27 in a direction perpendicular to the surface of the sample, thus impinging upon the wafer 11. Upon receiving the irradiation of the primary electron beam 31, secondary electrons, reflected electrons and backward scattered electrons are generated on the surface of the wafer 11, and, with a rotation-symmetry type electrostatic lens 14 producing an electric field in the vicinity of the surface of the wafer 11, led and accelerated in the direction perpendicular to the surface. Those electrons emerge from the surface of the sample 11 and are incident as secondary electron beams upon a projection optical unit.

The electron beam irradiating unit has an electron gun and two-stage quadrupole lenses 5, 6. The electron gun includes a cathode 1 composed of lanthanum hexaboride ($LaB_6$) which has an electron emission surface taking a rectangle having a dimension of 100 $\mu$m×10 $\mu$m, a wehnelt electrode (Wehnelt cylinder) formed with a rectangular opening, an anode 3 formed with a rectangle opening, and a beam-axis control deflector 4. The control units 7, 8, 9 control an acceleration voltage of the irradiated electron beam, an emission current and the optical axis. The electron beam irradiating unit further includes two-stage electrostatic quadrupole lenses 5, 6 and control unit 10 thereof in order to form a rectangular beam on the order of 100 $\mu$m×25 $\mu$m on the surface of the wafer 11. Note that the electron beam irradiating unit may be constructed so that a sectional configuration perpendicular to the irradiating direction of the primary electron beam 31 is not limited to the rectangle but may be linear or an elongate ellipse on condition that an aspect ratio thereof is over 1. The acceleration voltage of the primary electron beam 31 is determined based on a relationship between a resolution of the projection unit and an incidence voltage upon the wafer 11.

The primary electron beams 31 are emitted from the cathode 1 and converged by the quadrupole lenses 5, 6. The primary electron beams 31 then emerge from the electron beam irradiating unit and strike on the electron beam deflector 27. The primary electron beams 31 deflected by the electron beam deflector 27 then emerge out of the electron beam deflector 27.

Next, a flux of the primary electron beams 31 is reduced by the rotation-symmetry type electrostatic lens 14 and thereafter falls vertically upon the surface of the wafer 11. A voltage from a power source 15 is applied to the rotation-symmetry type electrostatic lens 14.

The sample unit is provided with a substrate stage 12 of which an upper surface is mounted with the wafer 11, a control unit 13 thereof and a power source 45, and is structured such that the voltage can be applied to the sample 11. The power source 45 applies a negative voltage to the wafer 11. The substrate stage 12 is so structured as to be movable and moves under the control of the control unit 13, whereby the surface of the wafer 11 can be scanned by the primary electron beams 31 through the movement of the stage.

Herein, a value of the voltage applied to the wafer 11 is determined based on a performance of resolution of the projection unit. For obtaining a resolution of, e.g., 0.1 m or under, a high energy is required of the voltage of the secondary electron beam 32, and it is therefore preferable that the sample application voltage be 5 kV. On the other hand, an energy of the primary electron beam 31 is determined from a difference the sample application voltage and the incidence voltage upon the sample 11. What is generally used as an incidence voltage upon the wafer 11 is on the order of 800 V in terms of avoiding the wafer 11 from being damaged by the irradiation of the electron beams and preventing the wafer 11 from being charged up. As a result, the voltage of the primary electron beam 31 becomes approximately 5.8 kV.

When the sample 11 is irradiated with the primary electron beams 31, the secondary electrons, the reflected electrons and the backward scattered electrons, which retain pieces of data on a configuration, a material and an electric potential of the surface of the water 11, are emitted from the surface of the wafer 11. The rotation-symmetry type electrostatic lens 14 generates the acceleration electric field between the electrostatic lenses, and, with this acceleration electric field, the electrons are led and thereafter accelerated in the direction perpendicular to the surface of the sample 11. The secondary electrons, the reflected electrons and the backward scattered electrons are thereby incident taking a form of secondary electron beams 32 upon the electron beam deflector 27 while making a trajectory parallel to the beam axis. Herein, the electron beam deflector 27 is controlled on such a condition as to permit the secondary electron beams 32 incident thereon from the side of the sample 11 to travel straight, and the secondary electron beams 32 therefore travel straight through within the electron beam deflector 27 and is thus incident upon an electron beam energy filtering element characteristic of the present invention. This electron beam energy filtering element transmits only the electron beams bearing an energy greater than a predetermined energy value with respect to the energy of the secondary electron beams 32 composed of the secondary electrons, the reflected electrons and the backward scattered electrons which have been generated on the wafer 11, and makes these transmitted electron beams incident upon the projection unit. A function of the electron beam energy filtering element will hereinafter be explained in greater details.

The projection unit includes three stage rotation-symmetry type electrostatic lenses. The secondary electron beams 32 are projected in enlargement by the rotation-symmetry type electrostatic lenses 16, 18, 20 to form an image on an MCP (Micro Channel Plate) detector 22. The control units 17, 19, 21 control voltages of the respective electrostatic lenses.

An electron beam detecting unit 61 has the MCP detector 22, a fluorescent surface 23, a light guide 24, and a CCD camera 25 including a CCD area sensor. The secondary electron beams 32 incident upon the MCP detector 22 are so amplified by the MCP detector 22 as to be raised to the fourth or fifth power of an electron quantity when incident, and thus fall upon the fluorescent surface 23. A fluorescent image, which is thereby formed on the fluorescent surface 23, is detected by the CCD area sensor through the light guide 24. Signals of the detected image are transmitted as image data via a control unit 67 to a host computer 28. The host computer 28 makes the image data displayed on a display unit 29, and an image signal processing unit 30 executes predetermined image processing thereon, and the processed data are stored in a memory 58. In the first embodiment, the fluorescent image is taken in by the CCD area sensor but may also be taken in by a TDICCD (Time Delay Integration Charge Coupled Device) sensor in synchronization with a movement of the substrate stage 12. This method is highly effective in the inspection at a higher speed.

Herein, a construction of the beam deflector 27 will be explained in brief with reference to FIGS. 5 and 6.

Figure 5:
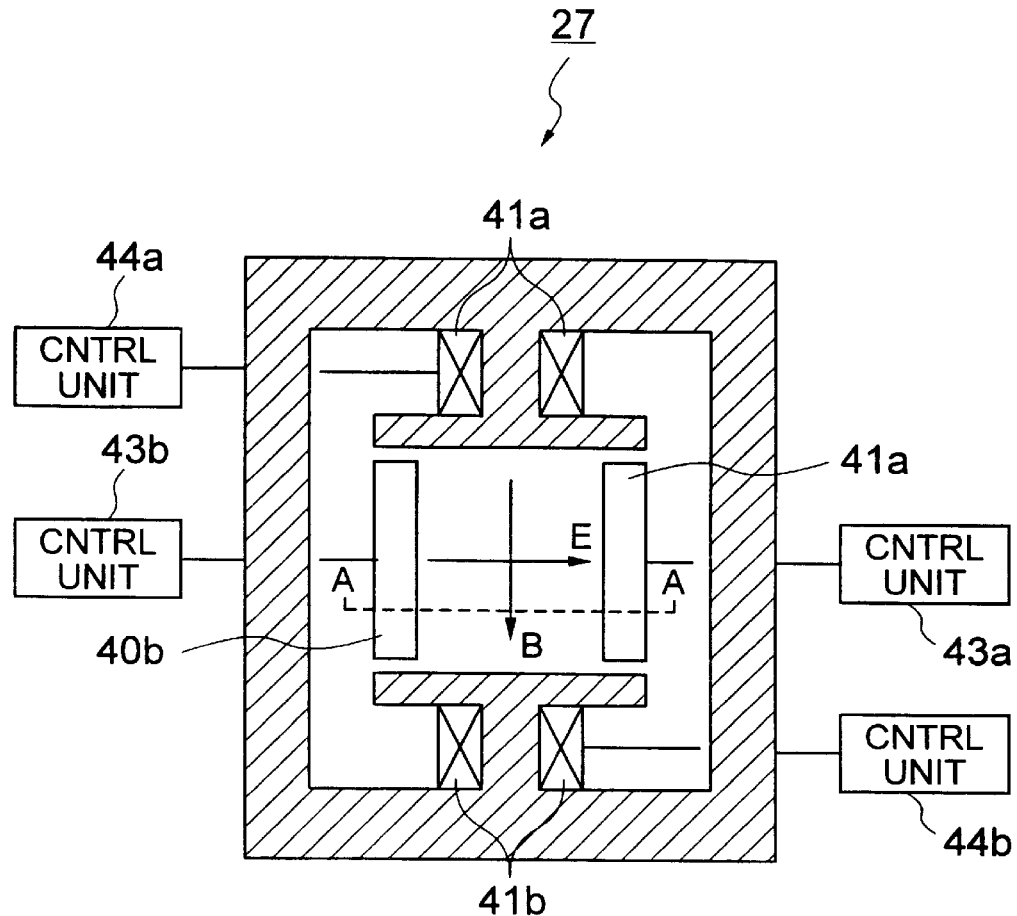
FIG. 5 is a sectional view showing a construction in details of an electron beam deflector of the substrate inspecting system shown in FIG. 4.

FIG. 5 is a sectional view fully showing the construction of the beam deflector 27 provided in the substrate inspection system 60 illustrated in FIG. 4.

As shown in FIG. 5, the beam deflector 27 has such a structure that an electric field E is orthogonal to a magnetic field B within the plane perpendicular to the beam axis of the projection unit (which is called an E×B structure).

Herein, the electric fields E are generated by parallel-plate electrodes 40a, 40b. The electric fields generated respectively by the parallel-plate electrodes 40a, 40b are controlled respectively by control units 43a, 43b. On the other hand, the magnetic fields B are generated by the electromagnetic coils 41a, 41b based on such a geometry that the electromagnetic coils 41a, 41b are disposed orthogonally to the parallel-plate electrodes 40a, 40b for generating the electric fields. A pole piece assuming a parallel-plate shape is provided for enhancing a uniformity of the magnetic field.

Figure 6:
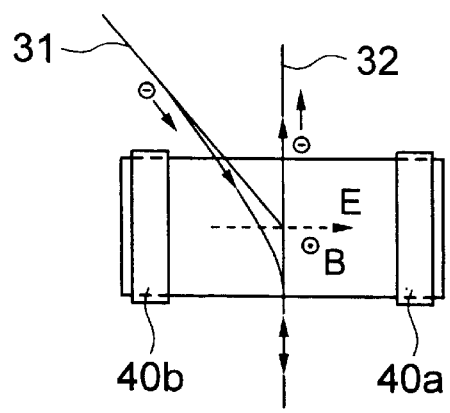
FIG. 6 is a sectional view taken along the line A—A in FIG. 5.

FIG. 6 is a sectional view taken along the line A—A in FIG. 5. The irradiated primary electron beams 31 are, as shown in FIG. 6, deflected by the electric fields E generated by the parallel-plate electrodes 40a, 40b and by the magnetic fields B generated by the electromagnetic coils 41a, 41b, and thereafter fall upon the rotation-symmetry type electrostatic lens 14 (see FIG. 4). The primary electron beams 31 penetrating the rotation-symmetry type electrostatic lens 14 are vertically incident on the surface of the sample 11 (see FIG. 4). On the other hand, the secondary electron beams 32 composed of the secondary electrons, the reflected electrons and the backward scattered electrons produced on the surface of the sample 11, are accelerated by the acceleration electric field generated between the sample 11 and the rotation-symmetry type electrostatic lens 14, and travel in the direction perpendicular to the surface of the sample 11. Then, the secondary electron beams 32, after having penetrated the rotation-symmetry type electrostatic lens 14, strike again on the beam deflector 27.

Herein, a position and an angle of incidence of the primary electron beam 31 upon the beam deflector 27, are univocally determined if the energies of the electron beams 31, 32 are determined. Further, for allowing the secondary electron beams 32 to travel straight, the respective control units 43a, 43b, 44a, 44b control the electric fields generated by the parallel-plate electrodes 40a, 40b and the magnetic fields generated by the electromagnetic coils 41a, 41b so as to satisfy a condition of the electric field E and the magnetic field B, i.e., vB=eE, where v is the velocity (m/s) of the secondary electron beams 32, B is the magnetic field (T), e is the electric charge quantity (C), and E is the electric field (V/m). The secondary electron beams 32 thereby travel straight through the electron beam deflector 27 and fall on the projection unit.

Next, an image obtaining method involving the use of the electron beam energy filtering element characteristic of the first embodiment, will be described referring to FIG. 7.

The electron beam energy filtering element includes a parallel-plate type energy filter 33 and a control unit 34 thereof. FIG. 7 is a schematic diagram showing the parallel-plate type energy filter 33 provided in the electron beam energy filtering element in the first embodiment.

Figure 7:
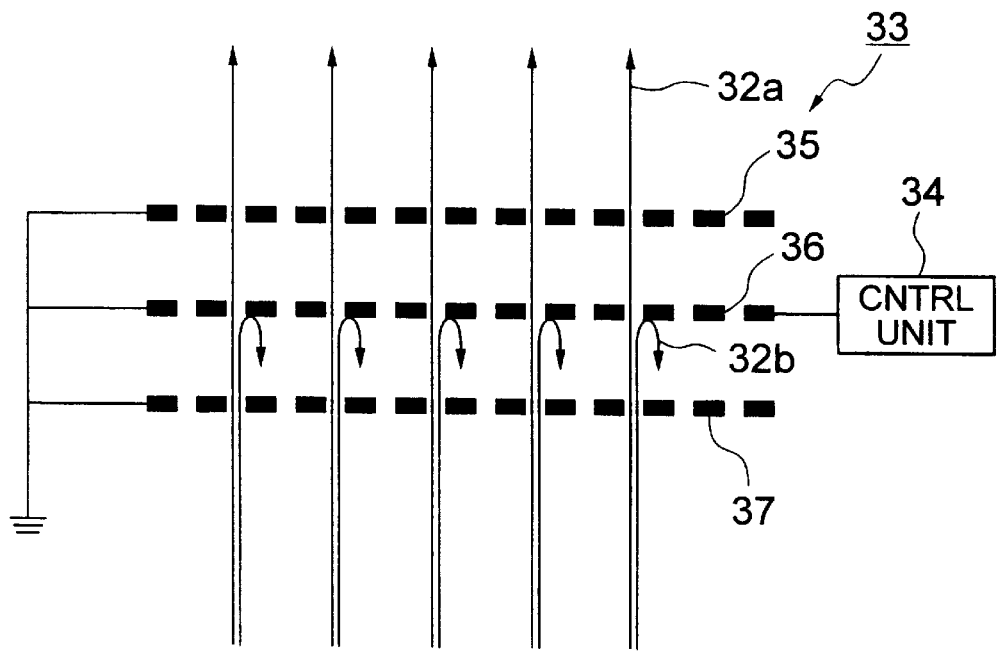
FIG. 7 is a view schematically showing a parallel-plate type energy filter incorporated into the substrate inspecting system shown in FIG. 4.

The parallel-plate type energy filter 33 shown in FIG. 7 includes mesh electrodes 35, 37 grounded, a mesh electrode 36 to which a voltage is applied, and the control unit 34 for applying the voltage to the mesh electrode 36. Herein, supposing that Vf be the voltage applied to the mesh electrode 36, only an electron beam 32a, having an energy equal to Vt or greater, among the secondary electron beams 32 penetrates the parallel-plate type energy filter 33. While on the other hand, an electron 32b having an energy under Vf is forced back to the sample 11 by dint of a deceleration electric field generated between the electrode 37 and the electrode 36.

The energy filter 33 having the configuration shown in FIG. 7 is capable of enhancing the filter voltage resolution most when the incident beam 32 is vertical to a filter electric field distribution. Accordingly, it is desirable that the parallel-plate type energy filter 33 be provided in an area in which the secondary electron beams 32 travel in parallel to the beam axis, i.e., provided between the electron beam deflector 27 and the rotation-symmetry type electrostatic lens 16, which meets a beam-collimated optical condition. Further, a projection unit provided other than between the electron beam deflector 27 and the rotation-symmetry type electrostatic lens 16, is formed with an optical system for collimating the secondary electron beams 32, and, if the electron beam energy filtering element is provided therein, the same effect can be expected. Note that even if provided in a non-collimated area, there is obtained the effect itself based on the energy separation, however, there must be a drawback in which the energy resolution might be deteriorated.

Figure 8:
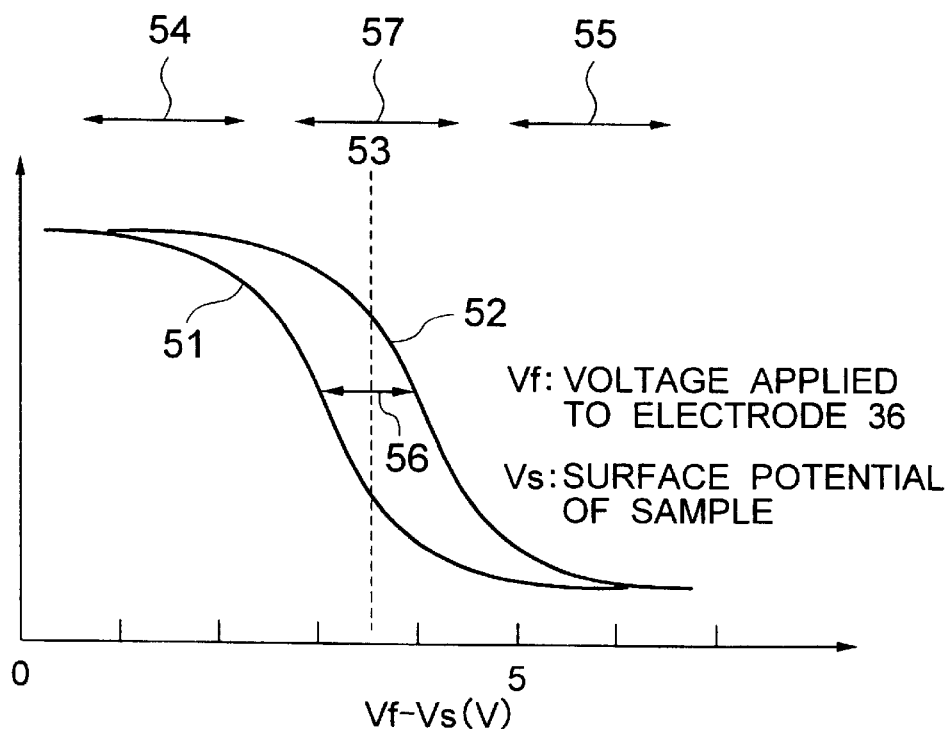
FIG. 8 is a characteristic diagram showing a relationship between a voltage Vf applied to the parallel-plate type energy filter shown in FIG. 7 and an intensity of a signal detected by an electron beam detecting unit.

FIG. 8 is a characteristic diagram showing a relationship between the applied voltage Vf to the electrode 36 with respect to a sample surface potential Vs and a signal intensity detected by the electron beam detector 61. As shown in FIG. 8, when the electrode voltage Vf is increased toward a positive voltage with respect to the sample surface potential vs, the signal intensity decreases, thus depicting a characteristic curve 51 known as an S-curve. This S-curve characteristic is influenced by the surface potential of the sample 11, and, in a region of being charged up to a positive potential in the surface area of the sample 11, the energy of the secondary electron beams diminish, with the result that the S-curve shifts on the left side. By contrast, in a region of being charged up to a negative potential, the energy of the secondary electron beams augments, and hence the S-curve shifts on the right side. Let an S-curve 51 be a characteristic curve of the detection signal intensity in a certain region where the sample surface potential increases on the positive side, and an S-curve 52 be a characteristic curve of the detection signal intensity in another region where the sample surface potential increases on the negative side. It follows that a shift quantity 56 of the electrode voltage Vf between the S-curves 51, 52 corresponds to a surface potential difference of the sample 11.

Referring to FIG. 8, the S-curves 51, 52 approach to each other in a voltage region 54 with a small value of Vf–Vs and a voltage region 55 with a large value of Vf–Vs in an area along the axis of abscissa indicating the electrode voltage Vf–the sample surface voltage vs. It can therefore be understood that a high S/N ratio is unable to be obtained from the signals of both of them. While on the other hand, a voltage region 57 therebetween, there appears a large difference in terms of the signal intensity between two surface potential states, and hence it is feasible to obtain a preferable S/N ratio. Such a characteristic is applied to a relative surface potential measurement base on the EB testing.

In the first embodiment, the wafer 11 is irradiated with the primary electron beams 31 each taking the rectangular shape, and the secondary electron beams 32 composed of the secondary electrons, the reflected electrons and the backward scattered electrons produced on the wafer 11 are projected to form the image. Therefore, what is important for detecting a change in the surface potential at a voltage contrast detective spot from the images within the irradiated area, is the S/N ratios of the image signals of the defective spot and the non-defective portion (the good quality portion). Let an S-curve 51 be a signal intensity characteristic of the image signal based on the secondary electron beams emerging from the non-defective portion, e.g., a wiring pattern 112 of a wafer 110 shown in FIG. 11, and let an S-curve 52 be a signal intensity characteristic of the image signal based on the secondary electron beams emerging from the electrically defective spot, e.g., a wiring pattern 113 of a wafer 110 shown in FIG. 11, wherein it is feasible to largely enhance the S/N ratios of the image signals of the defective spot and the non-defective portion by setting the electrode voltage Vf under the condition as shown in a broken line 53.

Further, from the image signals detected by the electron beam detecting unit 61, the filter voltage vf is controlled so that a quantity of the signals from the voltage contrast defecting spots becomes fixed, and a quantity of this fluctuation is monitored, thereby making is possible to quantitatively measure a relative surface potential at the voltage contrast defective spot. The electric characteristic such as a resistance value of the voltage contrast defect can be thereby quantitatively measured.

Next, a second embodiment of the substrate inspection system according to the present invention is explained with reference to the drawings.

Figure 9:
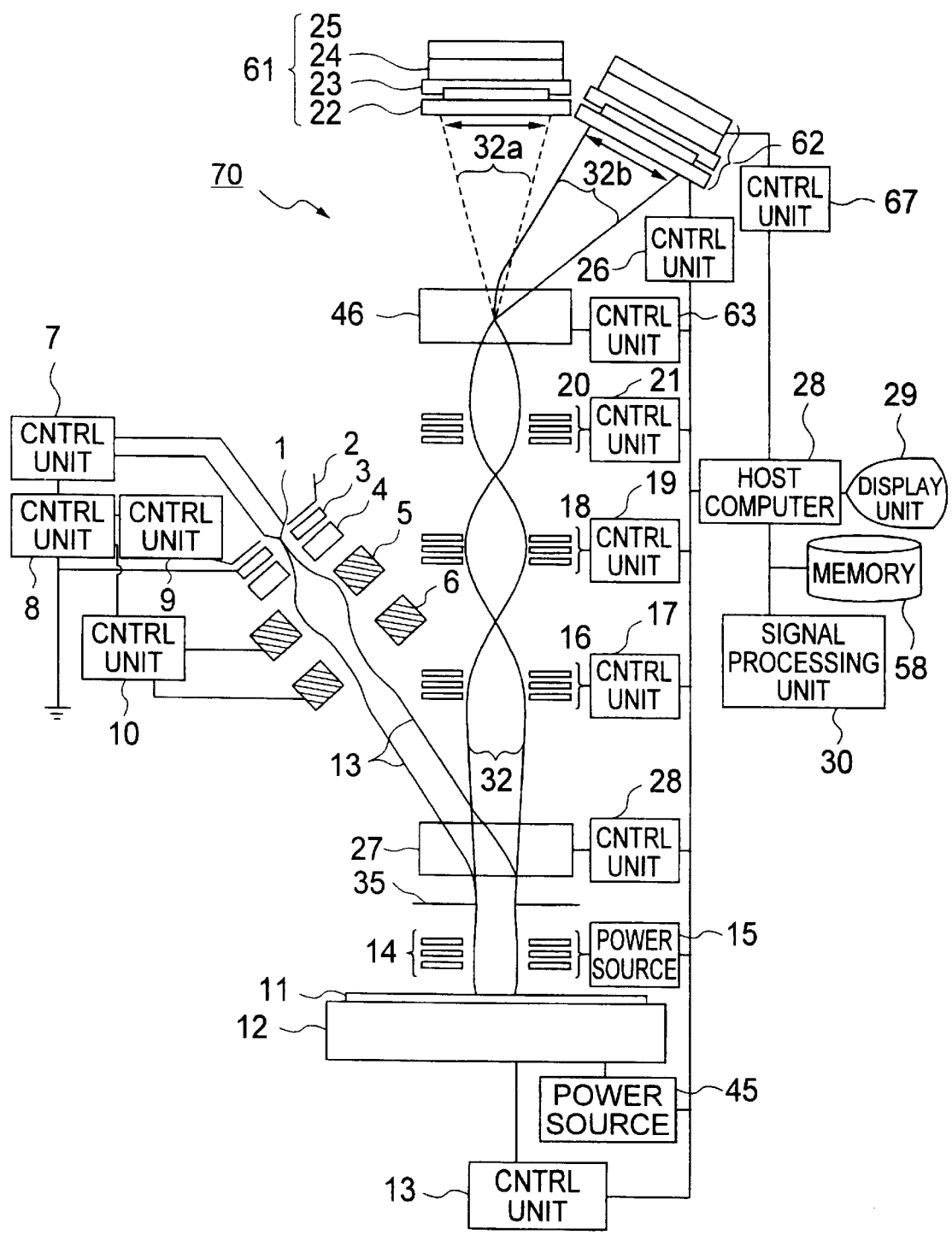
FIG. 9 is a block diagram showing a basic construction of a second embodiment of the substrate inspecting system according to the present invention.

FIG. 9 is a block diagram showing a basic construction of the substrate inspection system in the second embodiment. The components excluding the electron beam energy filtering element are the same as those in the first embodiment illustrated in FIG. 1.

As obvious in the comparison with FIG. 1, the substrate inspection system in the second embodiment is characterized by the electron beam energy filtering element disposed in an optically conditional position where the secondary electron beams form a crossover, i.e., a position where the secondary electron beams converge at a minimum confusion circle of which the center exists at one point on the beam axis between a rotation-symmetry type electrostatic lens 20 and an electron beam detecting unit 61, and by a second electron beam detecting unit 62 for forming an image of a secondary electron beam 32b as a part of the secondary electron beams separated by the electron beam energy filtering element.

In the second embodiment, the electron beam energy filtering element includes a magnetic field type energy filter 46 for generating a magnetic field orthogonal to the traveling direction of the secondary electron beams 32, and a control unit 63 thereof. The magnetic field type energy filter 46 permits a secondary electron beam 32a, having a high energy component, among the secondary electron beams 32 to travel straight, and the this secondary electron beam 32a is detected by an electron beam detecting unit 61. Further, the magnetic field type energy filter 46 deflects at a large angle a secondary electron beam 32b having a low energy component. This deflected electron beam 32b is guided to an electron beam detecting unit 62, by which image data of the lower energy component thereof is detected.

Figure 10:
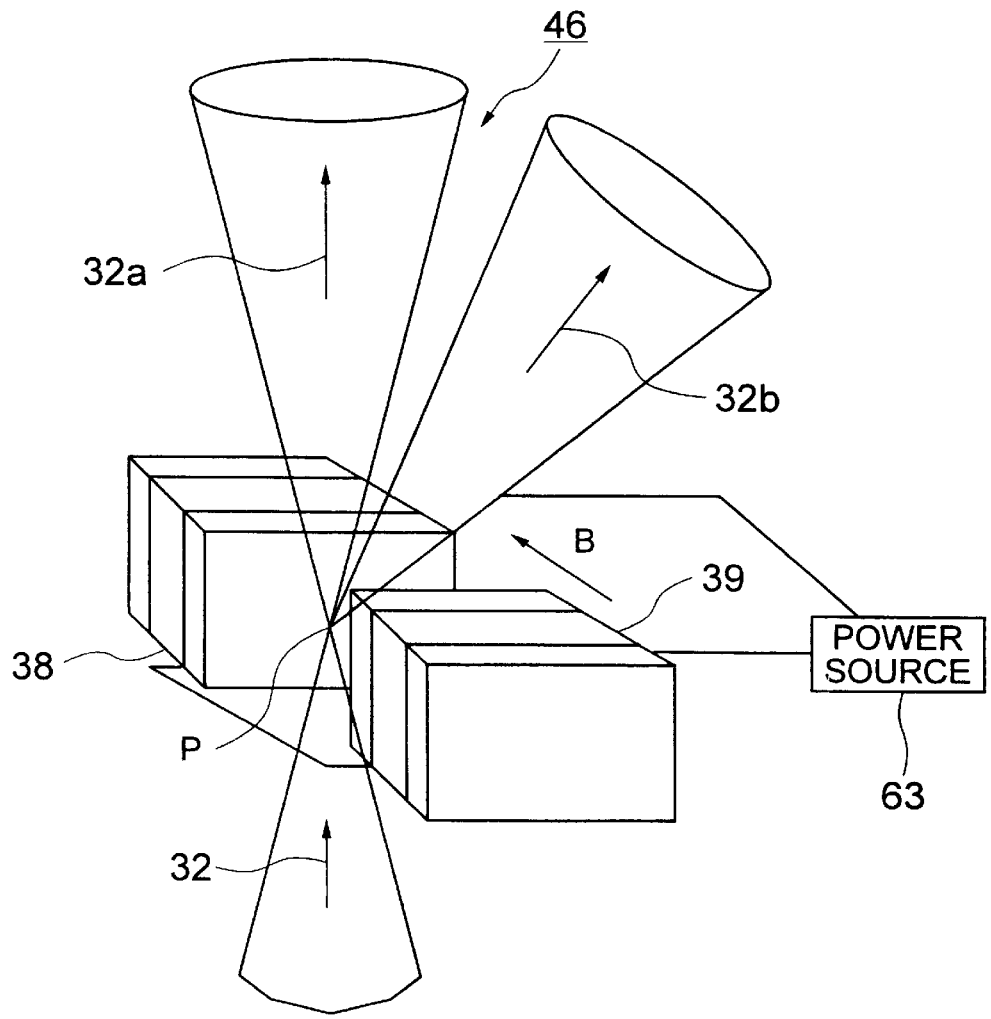
FIG. 10 is a perspective view showing a basic structure of a magnetic field type energy filter incorporated into the substrate inspecting system shown in FIG. 9.

FIG. 10 is a perspective view showing a basic structure of the magnetic field type energy filter 46. As shown in FIG. 10, the magnetic field type energy filter 46 has electromagnet coils 38, 39 disposed in a face-to-face relationship with an optical path of the secondary electron beams 32 being interposed therebetween, and a current source 63 for exciting these electromagnet coils 38, 39. The electromagnet coils 38, 39 are excited by the current source 63, thereby inducing the magnetic field B in the direction orthogonal to the traveling direction of the secondary electron beams 32.

Figure 11:
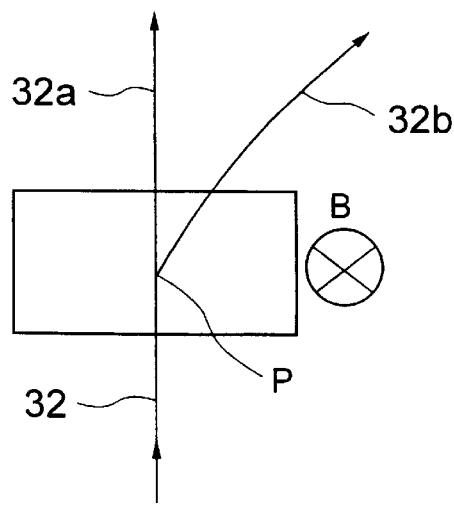
FIG. 11 is a schematic diagram showing a trajectory of electrons passing through the magnetic field type energy filter shown in FIG. 10.

FIG. 11 is a schematic view showing a trajectory of the electrons passing through the magnetic field type energy filter 46 shown in FIG. 7 as well as being a sectional view of FIG. 7 containing a virtual light source P, wherein the plane parallel to the side surfaces of the electromagnet coils 38, 39 on the side of the electron beams, serves as a cutoff plane As shown in FIG. 11, the high-energy electrons 32a travel straight without being influenced by the deflection magnetic field, while the low-energy electrons 32b are deflected by the magnetic field B and emerge at a predetermined angle from the magnetic field type energy filter 46. According to the parallel-plate type energy filter 33 (see FIG. 6) in the first embodiment, there is obtained the image of the electron beams bearing the higher energy than the filter voltage Vf, and it is required that the filter voltage Vf be changed for varying the energy component thereof. According to the magnetic field type energy filter 46 in the second embodiment, however, it is feasible to obtain simultaneously the images of the plurality of energy components simply by setting the deflection magnetic field fixed. Categories of the energy components are determined by a numerical quantity of the detecting units provided in the substrate inspecting apparatus.

The substrate inspecting apparatus in the second embodiment is, as shown in FIG. 6, capable of simultaneously taking in images of two energy regions because of its being provided with two electron beam detecting units 61, 62.

Given next is an explanation of how the substrate is inspected by use of the Substrate inspecting apparatus of the present invention.

When the substrate is irradiated with the electron beams, a local difference occurs in terms of the electric potential on the substrate surface corresponding to a configuration and a material of the substrate and a structure of an electric circuit based on thereon. This point will be explained more specifically referring to the drawings.

Figure 12:
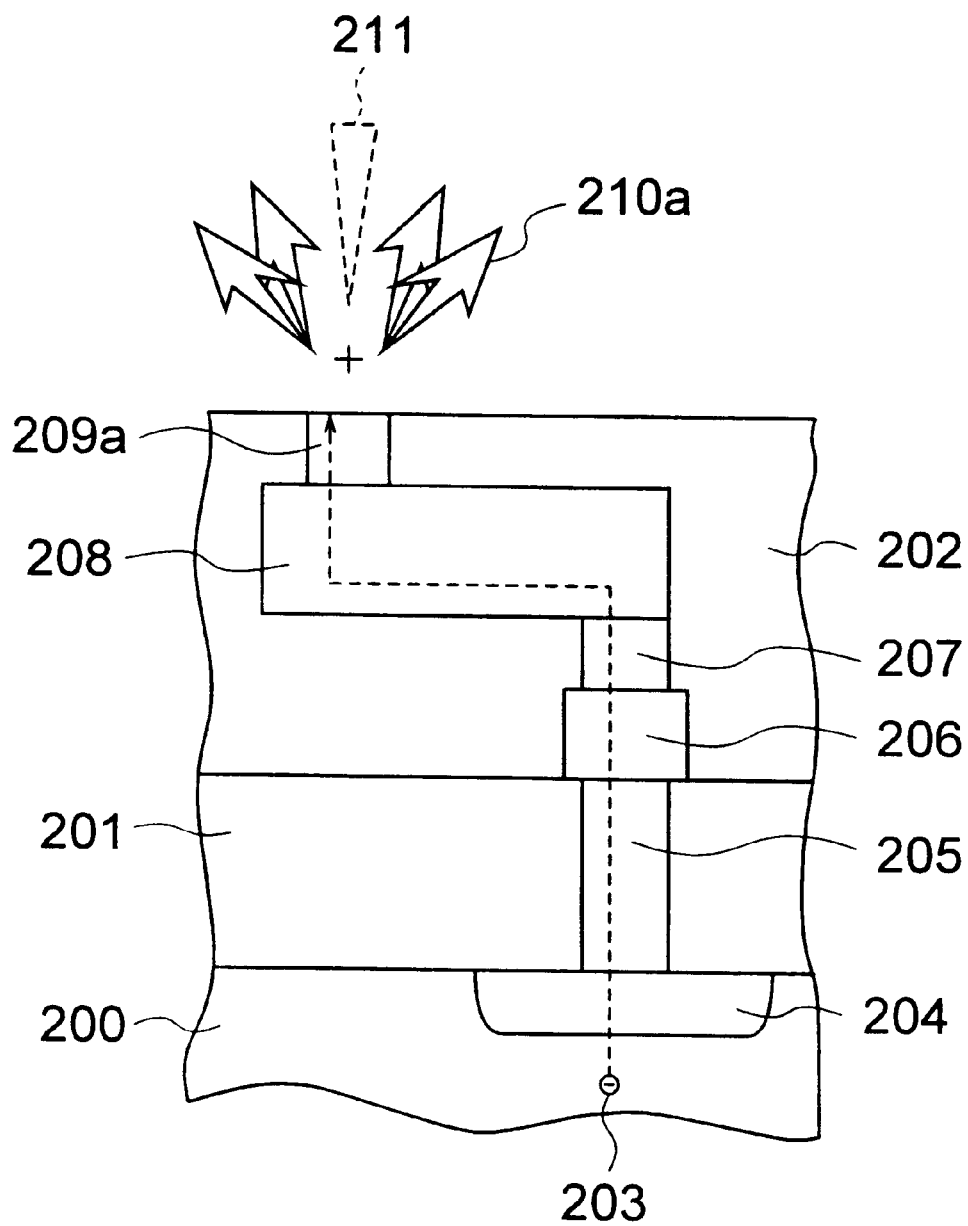
FIG. 12 is a partial sectional view schematically showing a normal portion on a substrate.
Figure 13:
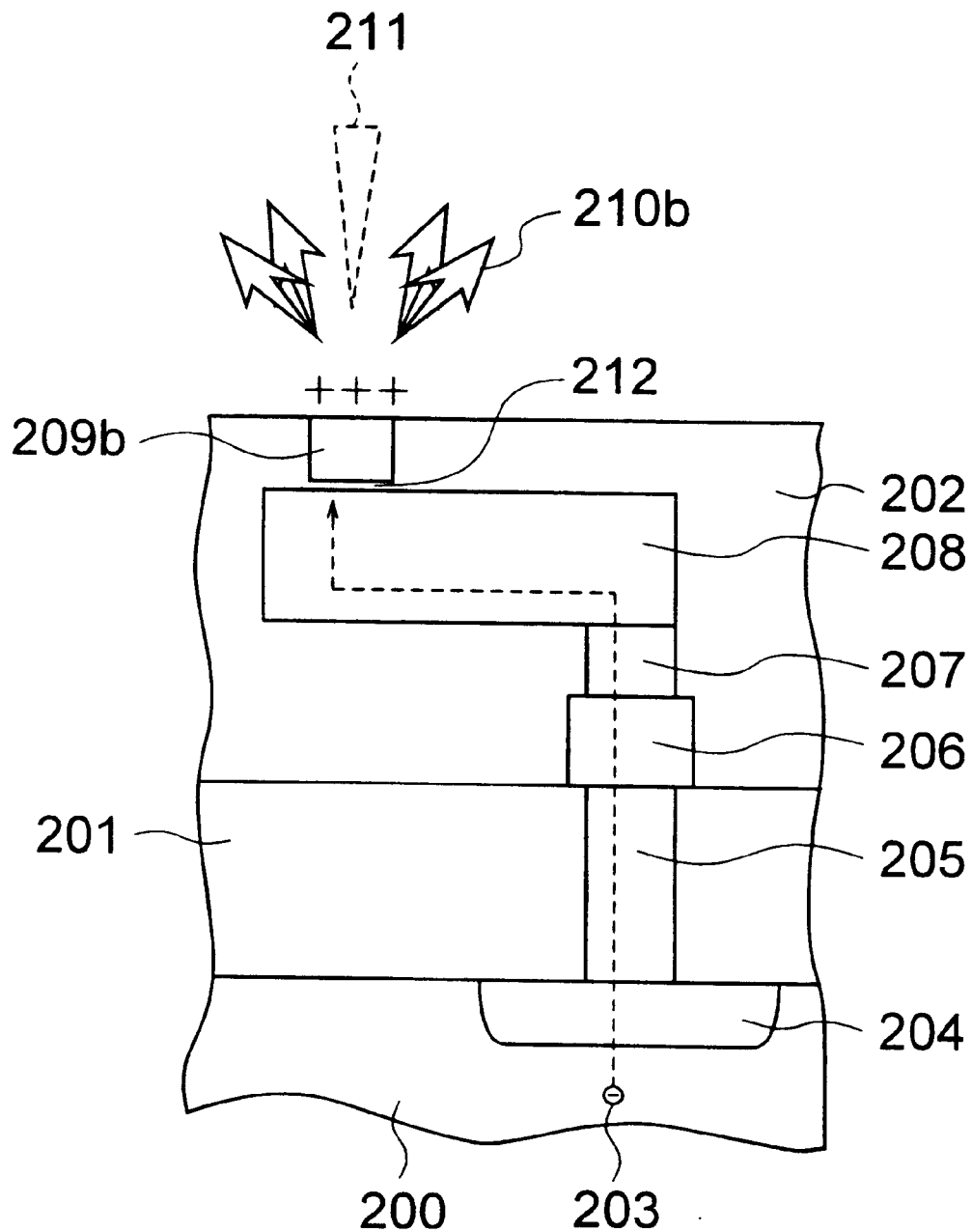
FIG. 13 is a partial sectional view schematically showing a defective portion on the substrate.

FIGS. 12 and 13 are sectional views schematically showing a defective portion and a normal portion on a substrate 200. AS shown in FIGS. 12 and 13, a semiconductor circuit device provided with a multi-layered wiring extending over a silicon dioxide layers 201 and 202. In the normal portion shown in FIG. 12, a second via plug 209a on the surface of the semiconductor substrate 200 is electrically connected to an impurity diffused layer 204 on the surface of the substrate via a second metal interconnection 208, a first via plug 207, a first metal interconnection 206 and an electrode contact 205. Note that FIG. 12 shows a structure in which the via plug involves the use of tungsten, and the surface under which the tungsten is embedded is flattened by chemical mechanical polishing.

When a primary beam 211 falls upon the surface of the via plug 209a shown in FIG. 12, a positive electric charge is produced on the surface of the via plug 209a. The multi-layered interconnection extending over to the via plug 209a and the impurity diffused layer 204 is, however, electrically normally conductive, and therefore the surface extending from the substrate 200 to the via plug 209a is supplied with electrons 203, thus effecting neutralization.

By contrast, in the defecting portion shown in FIG. 13, an open-circuit defective portion 212 exists between the second via plug 209b and the second metal interconnection 208, and hence second via plug 209b is not electrically conductive to the impurity diffused layer 204.

Accordingly, when the surface of the second via plug 209b shown in FIG. 13 is irradiated with primary beams 211, electrons 203 do not migrate from the substrate 200, resulting in a floating state. Then, the electric potential on the surface relatively changes to positive in terms of a balance with a release quantity of the secondary electrons (210b). In this case, positive electric charges occurred on the surface of the via plug 209b are not neutralized with the electrons migrating from the substrate, and a quantity of charging up is larger than in the case of being normally conductive as shown in FIG. 11.

Thus, there appears the difference in the electric potential between the surfaces of the via plugs 209a, 209b irradiated with the electron beams, depending on whether or not there is the electric conduction between the via plug 209 and the impurity diffused layer 204.

Such a potential difference on the surface of the substrate appears as a difference in terms of the energy quantity when the secondary electrons generated on the substrate surface fall upon a secondary optical system. Hence, an image forming condition of the secondary optical system under which the secondary beams generated from a portion exhibiting a different surface potential and incident upon the secondary optical system are projected to form an image on the electron detector, might differ per region on the substrate surface.

Accordingly, if a correlation between the secondary optical system image forming condition and the substrate surface potential is obvious beforehand, the secondary optical system is controlled so that the secondary beams are projected to properly form the image on the MCP detector, whereby the change in the substrate surface potential can be quantitatively measured.

Figure 14:
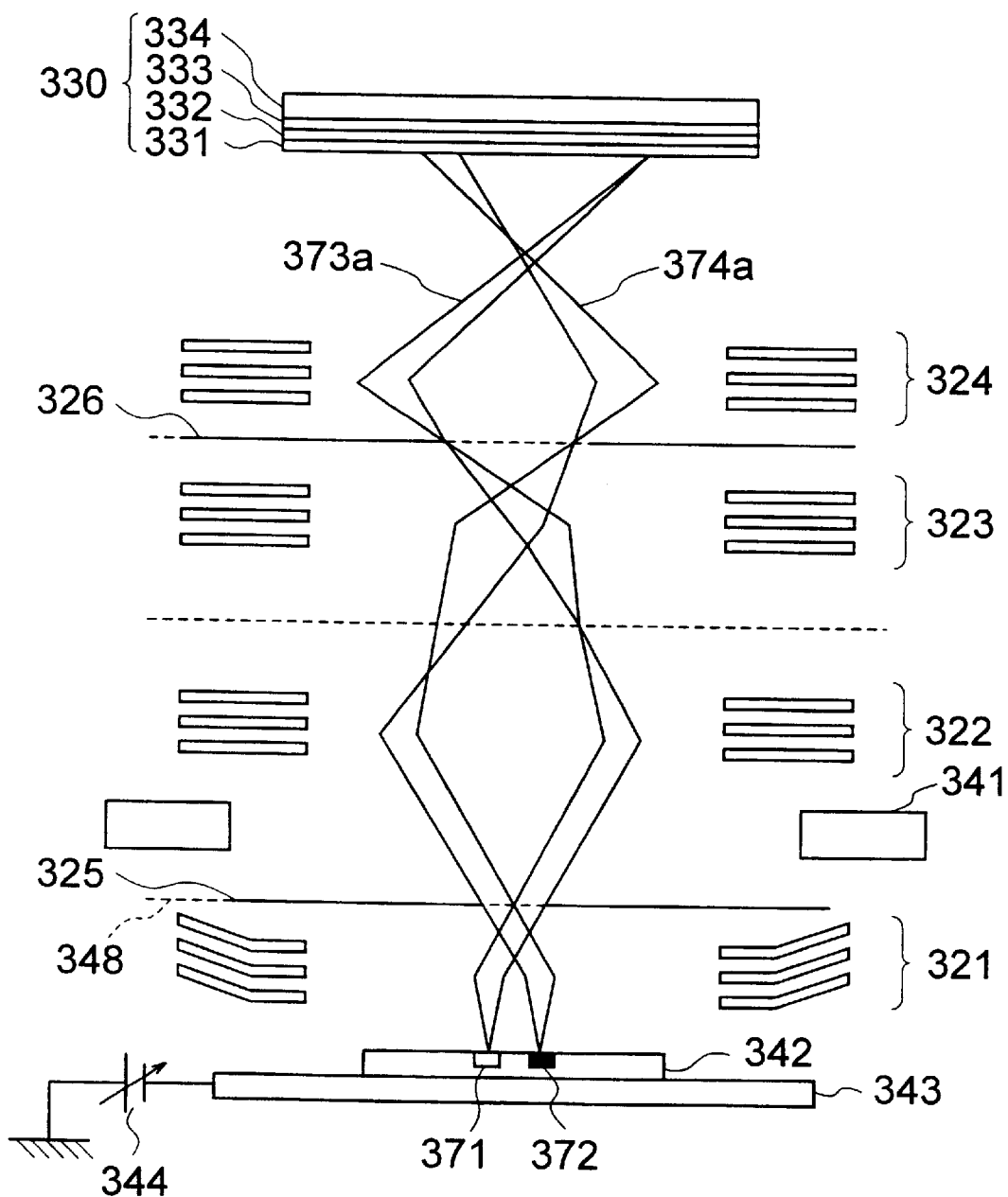
FIG. 14 is a view showing optical paths of electron beams when forming images of the electrons coming from normal and defective patterns.

FIG. 14 is a view showing an optical path of the electron beams when forming images of the electrons from a normal pattern and from a defective pattern.

A stage 343 is mounted with a wafer 342 including a normal pattern 371 and an open-circuit defective pattern 372 coming into an electrically floating state, and is biased to the negative potential by a power source 344.

This apparatus has a cathode lens 321, an aperture angle stop 325, an E×B type beam separator 341, a transfer lens 322, two-stage project lenses 323, 324, a field stop 326, and an electron detector 330 constructed of an MCP detector 331, a fluorescent screen 332, a light guide 333 and an imaging element 334.

A secondary electron beam 373a emerging from a normal via portion 371 is projected to form an image on the electron detector 330 through lens systems 321–324. By contrast, a defective via portion 372, as explained referring to FIG. 13, has a large amount of charging up quantity (positive electric charges), and it is therefore conceived that the surface potential thereof is higher in the positive direction than in the normal via portion 371. Hence, a secondary electron beam 374a released from the via portion 372 bears an energy lower by a potential difference between the via portions 371 and 372 than the secondary electron beam 373a, and becomes a electron beam of which an image is formed in front of the electron detector 330. As a result, an image the normal via portion appears in the form of a bright spot, while an image of the defective via portion appears as a dark spot.

Figure 15:
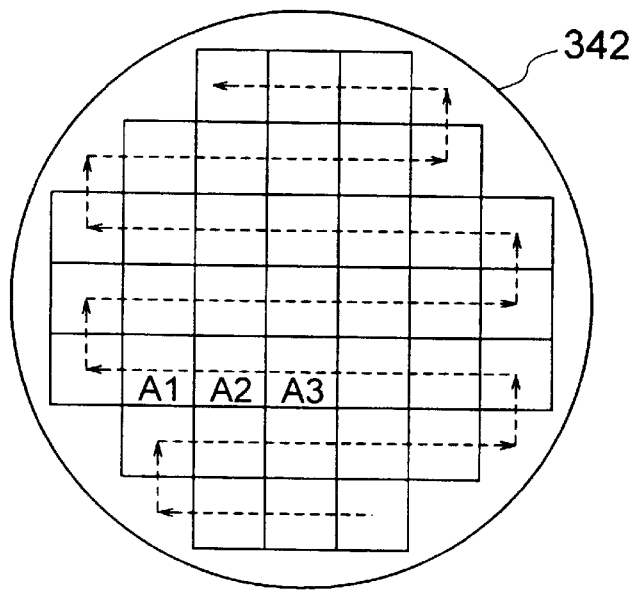
FIGS. 15A–15C are explanatory diagrams showing one example of a defect inspecting method.
Figure 15:
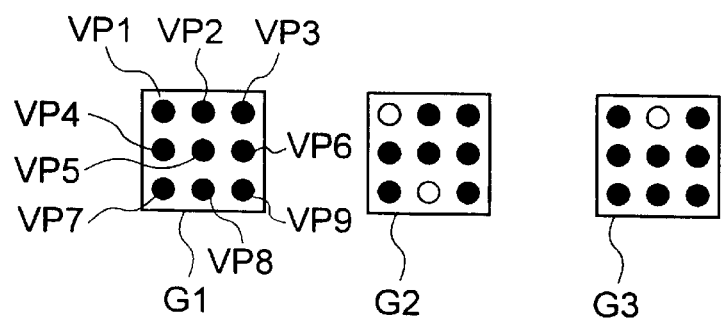
Figure 15:
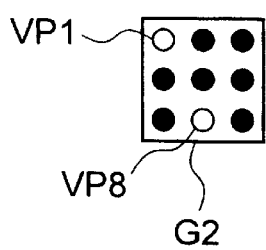

FIGS. 15A–15C are explanatory views showing one example of a defect inspecting method.

As shown in FIG. 15A, a die (a chip) formed on the wafer 342 is scanned in the lateral direction (the X-direction), and when reaching the side end thereof, an adjacent row thereof is scanned reversely in the X-direction after moving the wafer 342 in the vertical direction (the Y-direction). With repetitions of this operation, the entire surface of the wafer is thus inspected. Three pieces of adjacent dice A1,A2,A3 are herein exemplified, and images obtained therefrom are illustrated in FIG. 15B.

Paying attention to the die B, the image obtained from the die B is an image G2 shown in FIG. 15B. The image G2 is compared with an image G1 of the adjacent die A, and via portions (white via portions) VP1, VP8 exhibiting a different brightness are extracted. It is unknown only from the comparison between the two images G1 and G2 which side, G1 or G2, a defect exists, and therefore successively a comparison between G2 and G3 is made. The via portions VP1, VP8 are the same with G, G3, and are therefore, it proves, different with respect to only the image G2, whereby the defect shown in FIG. 15C can be detected. Such a comparison process involving the use of the three dice is referred to as a die-to-die comparison process.

Figure 16:
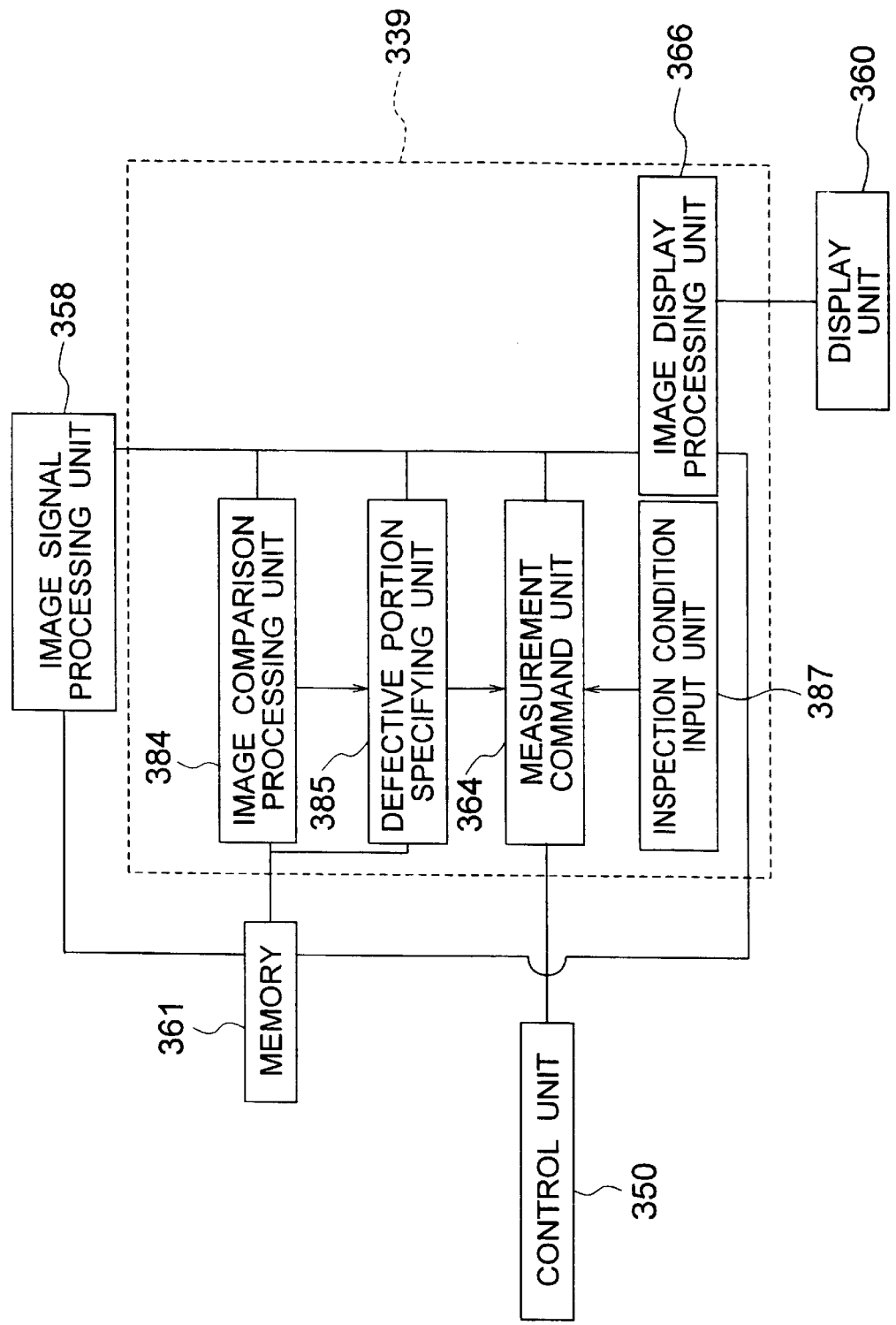
FIG. 16 is a block diagram showing a construction of a processing apparatus for executing a die-to-die comparison process.

FIG. 16 shows a construction of a computer system 339 serving as a processing apparatus for executing the die-to-die comparison process.

The host computer 339 includes an inspecting condition input unit 387 for inputting an inspecting condition, a measurement command unit 364 for suppling the respective control units with control signals till the measurement is finished since a measuring condition has been inputted, and an image display processing unit 366 for displaying an image on a display unit on the basis of a result of processing. In addition, the host computer 339 includes an image comparison processing unit 384 for comparing the images of the adjacent dice with each other, and a defective portion specifying unit 385 for specifying the defective portion from the compared result. Further, a memory 361 is connected to the image comparison processing unit 384 and the defective portion specifying unit 385, and the images stored therein are used when in the comparing process. Upon receiving a result of this comparison, the image signal processing unit 358 executes the signal processing.

Next, a method of detecting a defect in a pattern configuration will be explained with reference to FIGS. 17–19.

Figure 17:
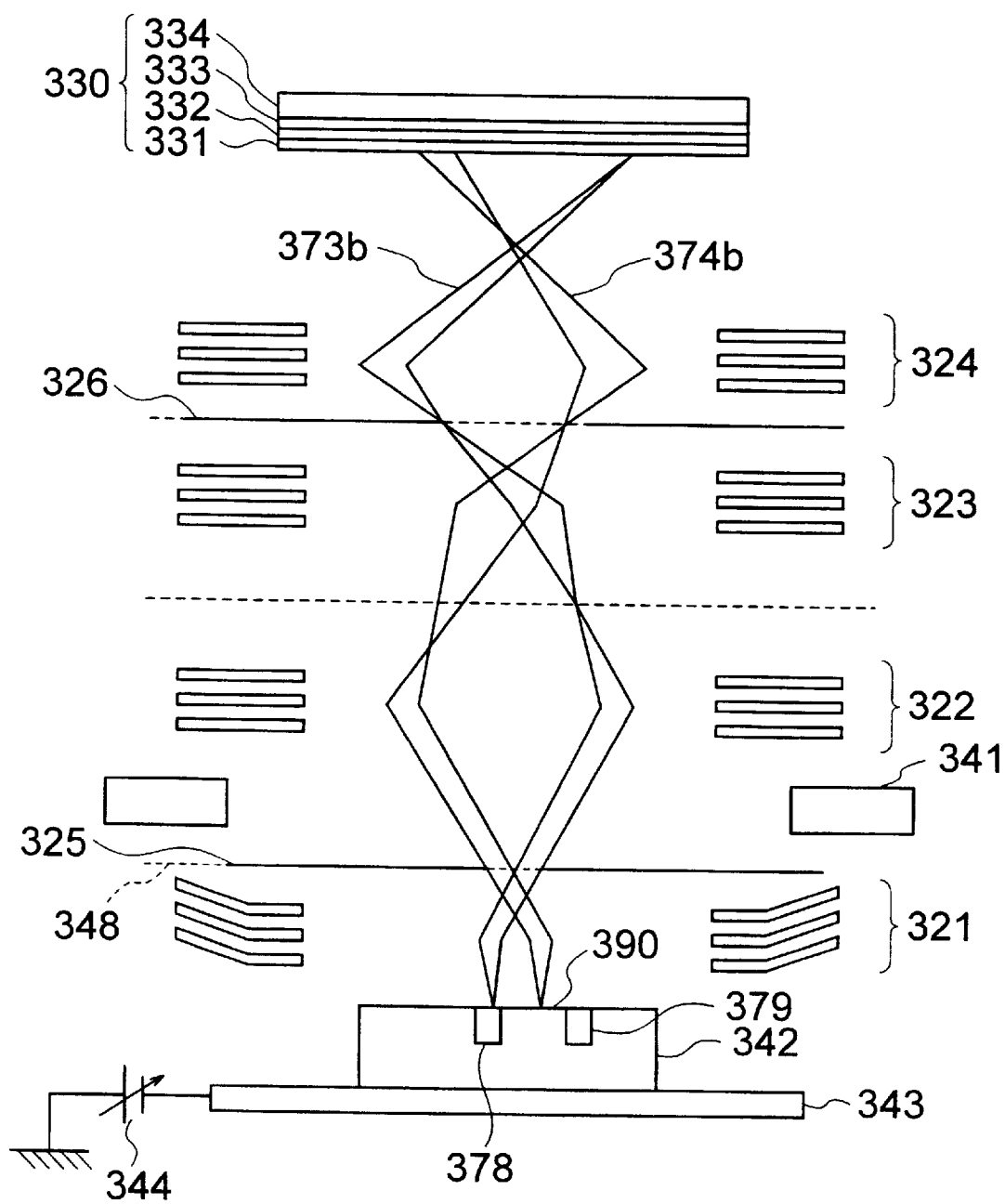
FIG. 17 is a view of an optical path of the electron beams, showing how an image of a interconnection pattern is formed.

FIG. 17 shows how an image of a wiring pattern is formed. The secondary electron beams generated from metal wiring areas 378, 379 are projected to form images on the detector 330, resulting in a bright pattern. On the other hand, the secondary electron beam generated on an insulating layer 390 between these wiring areas is unable to form an image on the detector 330 under the same image forming condition because of an energy of the secondary electron beam due to the charging up on the surface thereof, and turns out to be dark. Thus, the metal wiring areas are brightened, while the insulating layer between the wiring areas is darkened, thereby obtaining an image of the pattern in which a line and a space are alternately repeated as shown in FIG. 19B.

Figure 18:
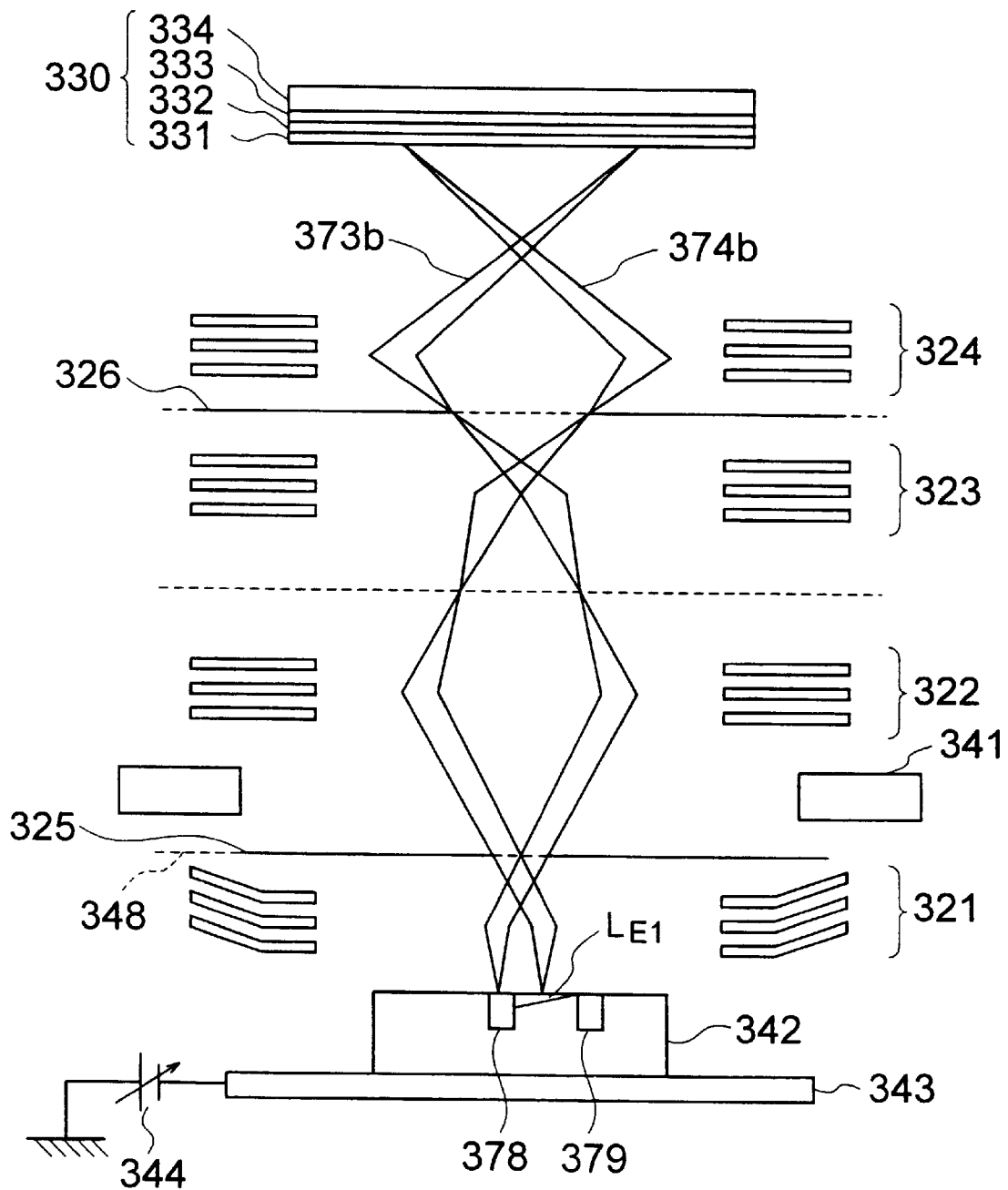
FIG. 18 is a view of an optical path of the electron beams, showing how an image is formed when a short-circuit occurs between the interconnection patterns.
Figure 19:
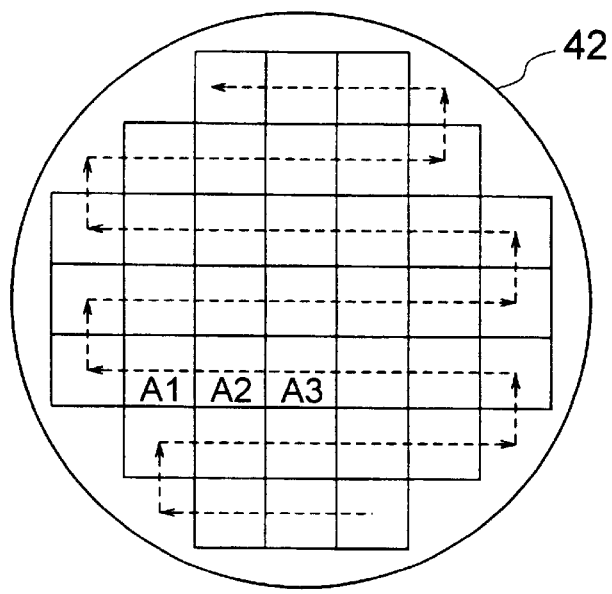
FIGS. 19A–19C are explanatory views showing one example of an inspecting method of inspecting the short-circuit between the interconnection patterns.
Figure 19:
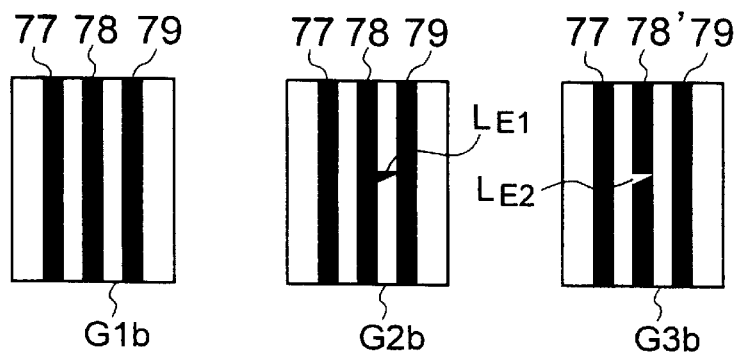
Figure 19:
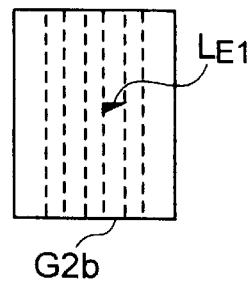

Herein, FIG. 18 illustrates a case where a short-circuit defect occurs between the interconnections due to an abnormality of the pattern. What is shown as a defect in FIG. 18 is a short-circuit defect LE1 between the adjacent interconnections 378 and 379, which is attributed to a metal embedded in a scratch formed when executing a flattening process based on CMP.

This short-circuit defect LE1 assumes the same potential as the metal interconnection, and hence the image is formed the same with the metal wiring area, showing the same contrast.

FIGS. 19A–19C are views corresponding to FIGS. 16A–16C, wherein images obtained from dice A1, A2, A3 are designated by G1b, G2b, G3b in such a case that the short-circuit defect LE1 exists in the die A2. As in the case of FIG. 16, FIG. 19C shows an image obtained by comparing the three dice with each other.

Figure 20:
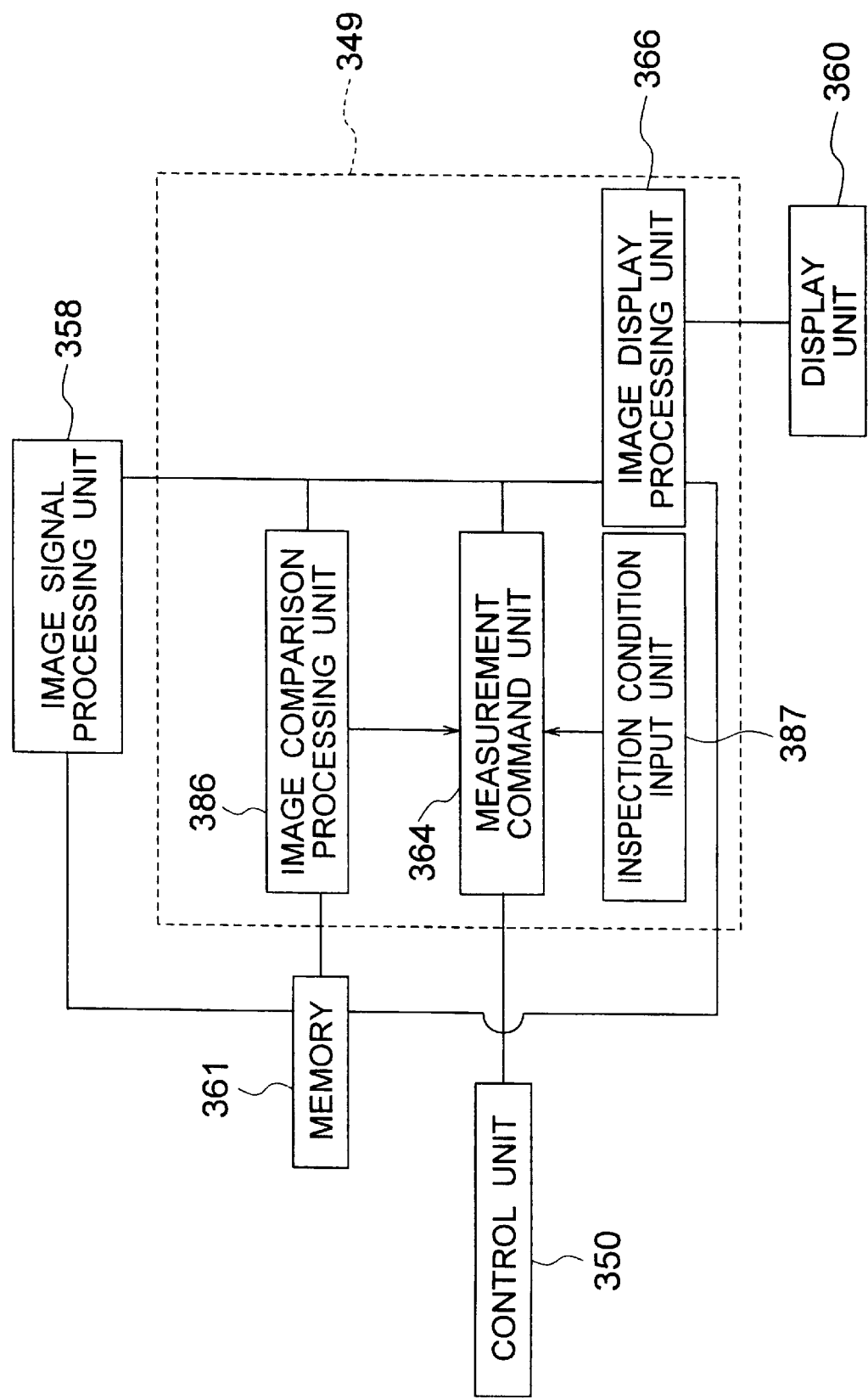
FIG. 20 is a block diagram showing a construction of a processing apparatus for inspecting a defect in a pattern configuration.

FIG. 20 shows a construction of the host computer 349 serving as a processing apparatus for performing the pattern inspection described above. A difference of the construction shown in FIG. 20 from the construction in FIG. 16 is only one point that the image comparison processing unit 384 and the defective portion specifying unit 385 are replaced with a configuration judging unit 386.

In this pattern inspection processing apparatus, the measurement command unit 364 irradiates arbitrary three unit regions A1, A2, A3 with the electron beams while moving the stage 343 as indicated by a broken arrow line in FIG. 18A under a predetermined image-forming condition, thereby obtaining image signals of electron imges G1b, G2b, G3b of the unit regions A1, A2, A3 as shown in FIG. 19B. The pattern inspection processing apparatus then stores the memory 361 with these image signals. The three unit regions are not limited to the regions adjacent to each other, and any regions are selectable. The configuration judging unit 386 takes the electron images G1b, G2b, G3b out of the memory 361, then cores the wiring areas corresponding thereto, and fetches the wring area different with respect to only the electron image G2b. For instance, in the example shown in FIG. 19C, the short-circuit defect LE1, which is formed between the interconnection 378 and the interconnection 379 and short-circuits these interconnections, is extracted as an interconnection configuration defect within the unit region A2, and may be stored in the memory 361.

In the embodiment illustrated in FIGS. 12 through 20, the filter is disposed in front of the electron detector, whereby the brightness and the darkness of the light can be separated more distinctly.

As discussed so far, the present invention, which has been carried out by way of the embodiments given above, is not limited to those Embodiments and may be modified in a variety of forms within the scope of the present invention without deviating from the gist thereof. In the second embodiment, the images of the two energy regions are taken in by the two electron beam detecting units. For example, three or more electron beam detecting units may be provided, which implies that the images of the three or more energy regions can be simultaneously taken in. Further, a single electron be detecting unit is used instead of a plurality of electron beam detecting units obtaining the images of a plurality of energy regions, and, if the detection region is divided within this single electron beam detecting unit and an image is obtained independently per divided detection region, the same effect can be acquired.

Moreover, the components of the respective units may properly be changed corresponding to the specifications. In the embodiments discussed above, the uniform deflection magnetic field type separator has been exemplified as the magnetic field type energy filter, however, the same effect can be obtained even when using an electric field/magnetic field overlap type separator such as an electromagnetic field prism and a Wiener filter.

Note that the inspecting system used for detecting the defect and the foreign material on the semiconductor wafer has been explained in the embodiments discussed above, however, as a matter of course, the present invention is applicable to the inspections of the substrates such as a photo mask etc without being confined to the semiconductor wafer.

What is claimed is:

1. A substrate inspecting apparatus comprising:
   primary electron beam irradiating means for irradiating a substrate defined as a sample with electron beams as primary electron beams;

projection means for guiding secondary electrons and reflected electrons generated on said substrate upon the irradiation of the primary electron beams, converging those electrons into secondary electron beams, and forming an image of the converged secondary electron beams;

electron beam separating means for separating the secondary electron beams on the basis of energy components corresponding to electric states on the surface of said sample, and fetching the separated electron beams;

electron beam detecting means for detecting the secondary electron beam, separated by said electron beam separating means, of which the image is then formed by said projection means, and outputting the detected secondary electron beam as an image signal; and image displaying means for, upon receiving the image signal from said secondary electron beam detecting means, displaying an image indicating a physical/electrical state on the surface of said substrate.

2. A substrate inspecting apparatus according to claim 1, wherein said electron beam separating means is an electrostatic parallel-plate type energy filer which transmits only the secondary electron beam having an energy larger than a predetermined value among the secondary electron beams.

3. A substrate inspecting apparatus according to claim 2, wherein said projection means includes collimating means for collimating the secondary electron beams so that the secondary electron beams travel in parallel to the beam axis thereof, and said electron beam separating means is disposed in a region where the secondary electron beams are collimated by said collimating means so as to travel in parallel to the beam axis thereof.

4. A substrate inspecting apparatus according to claim 1, further comprising a plurality of said electron beam detecting means, wherein said electron beam separating means is a magnetic field type energy filter for forming a deflection magnetic field, separating the electron beams on the basis of each of a plurality of energy regions, and fetching the separated electron beam, and said electron beam detecting means detects the secondary electron beam per energy region, and outputting the detected secondary electron beam as an images signal containing information indicating an electrical characteristic on the substrate surface which corresponds to the energy region.

5. A substrate inspecting apparatus according to claim 4, wherein said electron beam separating means is disposed in such a position that the secondary electron beams are converged on the beam axis by said projection means.

6. A substrate inspecting apparatus according to claim 1, wherein a section, perpendicular to the irradiating direction, of the primary electron beam emitting from said primary electron beam irradiating means, takes a thin and elongate configuration of which an aspect ration is over 1.

7. A substrate inspecting apparatus according to claim 1, further comprising electron beam deflecting means for changing an angle of incidence of the primary electron beam upon said sample, and a take-in angle of the secondary electrons and the reflected electrons to said projection means.

8. A substrate inspecting method comprising:

a first step of irradiating a substrate defined as a sample with electron beams as primary electron beams;

a second step of, guiding secondary electrons and reflected electrons generated on said substrate upon the irradiation of the primary electron beams, and making those electrons emerged as secondary electron beams;

a third step of separating the secondary electron beams on the basis of energy regions, and fetching the separated electron beams;

a fourth step of forming an image of the secondary electron be fetched based on said third step, and detecting and outputting mapping thereof as an image signal; and a fifth step of examining a physical/electric characteristic on the surface of said substrate on the basis of the image signal.

9. A substrate inspecting method according to claim 8, wherein said third step is a step of separating the secondary electron beams in a region where the secondary electron beams travel in parallel to the beam axis, and said fifth step includes a step of measuring a change in intensity of the secondary electron beams fetched in said third step, and thereby quantitatively measuring a relative change in electric potential on the surface of said substrate.

10. A substrate inspecting method according to claim 9, wherein said third step is a step of separating the secondary electron beams according to a plurality of energy regions in such a position that the secondary electron beams converge on the beam axis, and fetching the separated secondary electron beams, and said fourth step is a step of detecting the mappings according to the energy regions, and outputting a plurality of image signals corresponding to the mappings.

11. A substrate inspecting system comprising:

(1) a substrate inspecting apparatus including:
   (a) primary electron beam irradiating means for irradiating a substrate defined as a sample with electron beams as primary electron beams;
   (b) projection means for guiding secondary electrons and reflected electrons generated on said substrate upon the irradiation of the primary electron beams, converging those electrons into secondary electron beams, and forming an image of the converged secondary electron beams;
   (c) electron beam separating means for separating the secondary electron beams on the basis of energy components corresponding to electric states on the surface of said sample, and fetching the separated electron beams;
   (d) electron beam detecting means for detecting the secondary electron beam, separated by said electron beam separating means, of which the image is then formed by said projection means, and outputting the detected secondary electron beam as an image signal; and
   (e) image displaying means for, upon receiving the image signal from said secondary electron beam detecting means, displaying an image indicating a physical/electrical state on the surface of said substrate; and (2) a CPU including:
   (a) signal processing means for processing the image signals; and
   (b) storage means for storing image data outputted by said signal processing means, wherein said CPU controls said substrate, said signal processing means and said storage means in accordance with a first step of irradiating a substrate defined as a sample with electron beams as primary electron beams; a second step of, guiding secondary electrons and reflected electrons generated on said substrate upon the irradiation of the primary electron beams, and making those electrons emerged as secondary electron beams; a third step of separating the secondary electron beams on the basis of energy regions, and fetching the separated electron beams; a fourth step of forming an image of the secondary electron beams fetched based on said third step, and detecting and outputting mapping thereof as an image signal; and a fifth step of examining a physical/electric characteristic on the surface of said substrate on the basis of the image signal.

12. A substrate inspecting system according to claim 11, further comprising image comparison processing means for comparing image of a die to be inspected with reference images expressing substrate surface potential distribution.

13. A substrate inspecting system according to claim 12, wherein said reference images are images of neighboring dies to the die to be inspected.

14. A substrate inspecting system according to claim 13, further comprising detective portion specifying means for specifying defective portion in the die to be inspected from a comparison result from said image compatative processing means.

15. A substrate inspecting system according to claim 13, further comprising configuration judging means for judging pattern configuration to find defective pattern configuration from a comparison result from said image comparison processing means.

16. A substrate inspecting system according to claim 11, further comprising stage moving means for moving a substrate under test die by die.

* * * * *